(12) United States Patent  
Okada

(10) Patent No.: US 6,664,162 B2
(45) Date of Patent: Dec. 16, 2003

(54) METHOD OF MANUFACTURING CAPACITOR

(75) Inventor: Masakazu Okada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/202,790

(22) Filed: Jul. 26, 2002

(65) Prior Publication Data

US 2003/0060017 A1 Mar. 27, 2003

(30) Foreign Application Priority Data

Sep. 27, 2001 (JP) ........................................ 2001-296238

(51) Int. Cl.[7] .......................................... H01L 21/8242
(52) U.S. Cl. ......................... 438/243; 438/250; 438/253
(58) Field of Search .......................... 438/238, 243–256, 438/386–392

(56) References Cited

U.S. PATENT DOCUMENTS 5,691,252 A * 11/1997 Pan ........................... 438/243
6,492,224 B1 * 12/2002 Jao ........................... 438/241

FOREIGN PATENT DOCUMENTS

| JP | 11-163265 | 6/1999 |
| JP | 11-261003 | 9/1999 |
| JP | 2000-223570 | 8/2000 |

* cited by examiner

Primary Examiner—Jey Tsai
(74) Attorney, Agent, or Firm—Oblon, Spivak, McClelland, Maier & Neustadt, P.C.

(57) ABSTRACT

An isolation oxide film (2) has a recess. The bottom of the recess is below the upper surfaces of a P well (21) and an N well (22). A capacitor is provided on the bottom of the recess.

14 Claims, 15 Drawing Sheets

F I G. 15
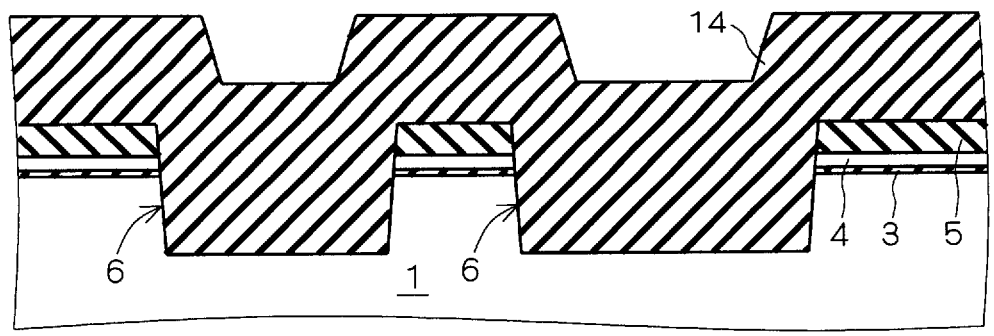
F I G. 16
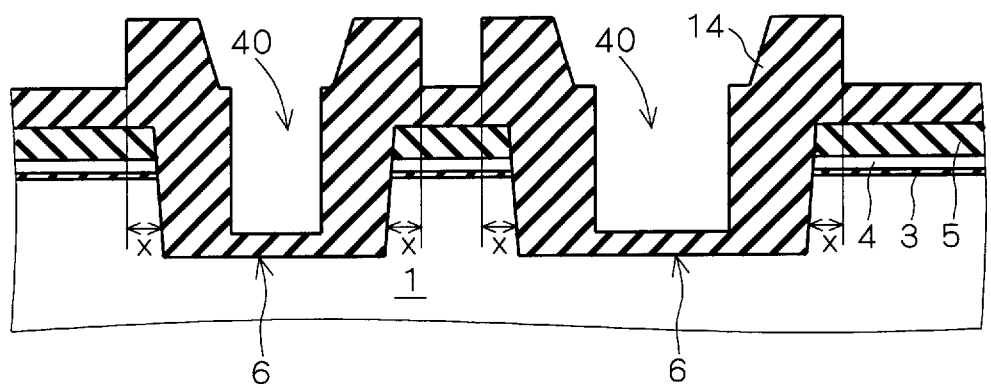
F I G. 17
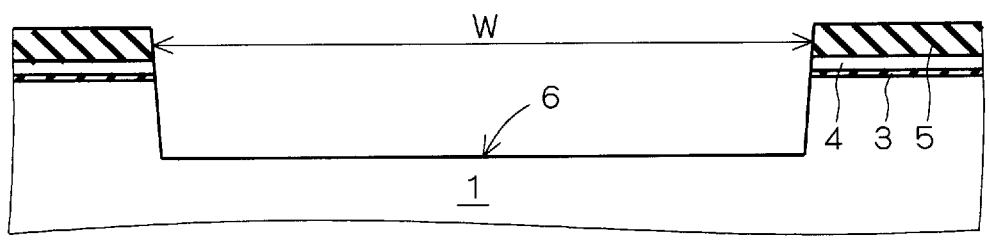

F I G. 24
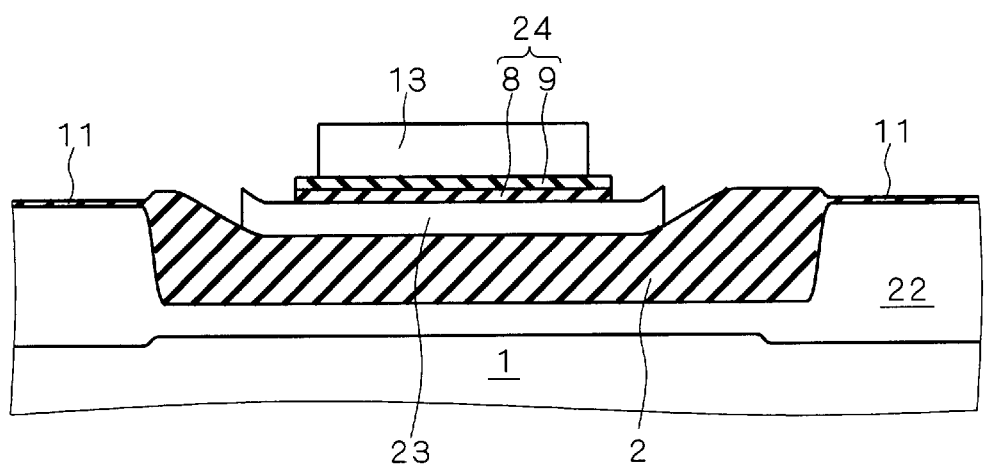
F I G. 25
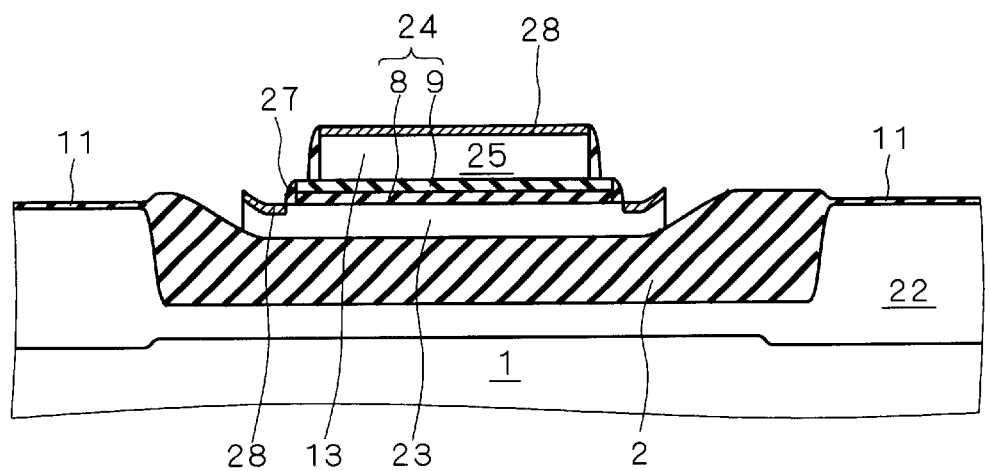

METHOD OF MANUFACTURING CAPACITOR

BACKGROUND OF THE INVENTION

1. Field of the Invention

The present invention relates to a technique for forming a capacitor and, more particularly, to a technique for forming a capacitor having a pair of electrodes each made of a polycrystalline semiconductor.

2. Description of the Background Art

FIGS. 28 through 38 are schematic sectional views showing a background art method of manufacturing a capacitor in a step-by-step manner. A structure in which a base layer 1, a semiconductor oxide film 3, a semiconductor film 4 and a semiconductor nitride film 5 are stacked in the order named is prepared, as shown in FIG. 28. The base layer 1 is made of, e.g., silicon, and the semiconductor oxide film 3 is made of, e.g., silicon oxide. The semiconductor film 4 is made of, e.g., polycrystalline silicon (polysilicon), and the semiconductor nitride film 5 is made of, e.g., silicon nitride.

Next, using a photolithographic technique, etching is performed upon the structure shown in FIG. 28 to selectively remove the semiconductor oxide film 3, the semiconductor film 4, the semiconductor nitride film 5 and the base layer 1, thereby forming trenches 6, as shown in FIG. 29.

Then, a semiconductor oxide film 14 made of, e.g., silicon oxide is deposited on the structure shown in FIG. 29. The trenches 6 are filled with the semiconductor oxide film 14. A photolithographic technique is used to selectively remove the semiconductor oxide film 14. Specifically, a portion of a surface of the semiconductor nitride film 5 which is spaced not less than a predetermined distance x apart from the trenches 6 is selectively exposed. This provides a structure shown in FIG. 30.

Next, chemical-mechanical polishing (CMP) is performed to remove other semiconductor oxide film 14 than fills the trenches 6. The semiconductor nitride film 5 and the semiconductor film 4 are removed by using wet etching. The remaining portions of the semiconductor oxide film 14 subjected to these processes become isolation oxide films 2 shown in FIG. 31.

A photolithographic technique and an impurity implantation process are used to form a P well 21 and an N well 22 shown in FIG. 32 in an upper surface of the base layer 1 under the isolation oxide films 2 and the semiconductor oxide film 3.

A polycrystalline semiconductor film having a thickness of about 1000 angstroms is deposited on the structure shown in FIG. 32. The polycrystalline semiconductor film is made of, e.g., doped polysilicon. A removal process using a photolithographic process is performed so that the polycrystalline semiconductor film remains selectively over the P well 21 (on the opposite side of the P well 21 from the base layer 1). This provides a structure shown in FIG. 33. The remaining portion of the polycrystalline semiconductor film serves as a lower electrode 23 of a capacitor to be described later.

Next, a semiconductor oxide film 8, a semiconductor nitride film 9 and a semiconductor oxide film 10 are deposited in the order named on the structure shown in FIG. 33. The semiconductor oxide film 8, the semiconductor nitride film 9 and the semiconductor oxide film 10 are, e.g., 200, 300 and 500 angstroms, respectively, in thickness. A photolithographic technique is used to selectively remove the semiconductor oxide film 10 so that the semiconductor oxide film 10 remains only over the lower electrode 23. The dimension of the remaining portion of the semiconductor oxide film 10 is smaller than that of the lower electrode 23. Thereafter, using the remaining portion of the semiconductor oxide film 10 as a mask, wet etching is performed to selectively remove the semiconductor oxide film 8 and the semiconductor nitride film 9. This provides a structure shown in FIG. 34. The remaining portions of the semiconductor oxide film 8 and semiconductor nitride film 9 function as a dielectric layer 24 of the capacitor to be described later.

The semiconductor oxide film 3, which has been damaged by the processes performed thus far, is removed by wet etching. In this process, the remaining portion of the semiconductor oxide film 10 is also removed. An oxidation process is performed anew to form an oxide film 11 on the upper surfaces of the P well 21 and the N well 22. This provides a structure shown in FIG. 35. The oxide film 11 functions also as a gate oxide film of a MOS transistor to be described later.

Next, a polycrystalline semiconductor film 13 is deposited on the structure shown in FIG. 35. The polycrystalline semiconductor film 13 is made of, e.g., polysilicon. A photolithographic technique is used to selectively remove the polycrystalline semiconductor film 13 so that portions of the polycrystalline semiconductor film 13 remain on the oxide film 11 and the isolation oxide film 2 over the P and N wells 21 and 22 in spaced apart relation to the lower electrode 23, and on the semiconductor nitride film 9. The dimension of the portion of the polycrystalline semiconductor film 13 remaining on the semiconductor nitride film 9 is smaller than that of the semiconductor nitride film 9. This provides a structure shown in FIG. 36. The portion of the polycrystalline semiconductor film 13 remaining on the semiconductor nitride film 9 is subjected to ion implantation to be described below to thereby function as an upper electrode which, in conjunction with the lower electrode 23, constitutes the capacitor with the dielectric layer 24 therebetween. The portion of the polycrystalline semiconductor film 13 remaining on the oxide film 11 and the isolation oxide film 2 is subjected to ion implantation to be described below to thereby function as a gate electrode of a MOS transistor which forms a channel in the upper surface of each of the P well 21 and the N well 22 thereunder. The portion of the polycrystalline semiconductor film 13 functioning as the gate electrode of an NMOS transistor to be formed in the P well 21 is not shown in FIG. 36.

Thereafter, ions are implanted into the remaining portions of the polycrystalline semiconductor film 13 and the oxide film 11 over the P well 21 and the N well 22 to form a source/drain region 26, a gate electrode 29, and an upper electrode 25 of the capacitor shown in FIG. 37. The gate electrode of the MOS transistor to be formed in the P well 21 and the source/drain region of the MOS transistor to be formed in the N well 22 are not shown in the sectional view of FIG. 37.

The source/drain regions of the MOS transistors are exposed by the selective removal of the semiconductor oxide film 11 thereover. Silicide films 28 are formed on the exposed surfaces of the source/drain regions and the gate electrodes. In the ion implantation process, sidewalls 27 made of, e.g., TEOS may be used as a mask in addition to a mask using a resist to be described later. The removal of the resist provides a structure shown in FIG. 37.

Next, an interlayer insulation film 30 made of, e.g., silicon oxide is deposited on the entire top surface, and chemical-mechanical polishing is performed to planarize the surface of the interlayer insulation film 30. A photolithographic technique is used to form contact holes for electrical connections to the source/drain region 26, the gate electrode 29, and the upper and lower electrodes 25 and 23 of the capacitor. Barrier metals 35 are formed in the respective contact holes. Electrodes 36 are formed which fill the respective contact holes with the barrier metals 35 therebetween and protrude from the surface of the interlayer insulation film 30.

In general, the base layer 1 in the step shown in FIG. 28 has a flat surface, and the upper electrode 25 and the gate electrode 29 are formed from the polycrystalline semiconductor film 13. Thus, a distance $D_0$ (see FIG. 36) between the upper electrode 25 and the gate electrode 29 at their farthest locations from the base layer 1 as measured in the thickness direction of the base layer 1 is approximately equal to the sum of the thickness of the lower electrode 23 and the thickness of the dielectric layer 24. In the above example, the topmost portion of the gate electrode 29 is about 1500 angstroms below the topmost portion of the upper electrode 25 because the lower electrode 23, the semiconductor oxide film 8 and the semiconductor nitride film 9 are about 1000, 200 and 300 angstroms, respectively, in thickness.

A resist 50 serving as a mask is used in the ion implantation for the formation of the upper electrode 25, the source/drain region 26 and the gate electrode 29. FIG. 39 is a sectional view schematically showing the resist 50. The resist 50 has a substantially flat surface independently of the surface asperities of an object to be covered by the resist 50. The patterning to be actually used is not shown in FIG. 39, and hence the resist 50 is shown as formed entirely without any specified position to be opened therein.

In view of the foregoing, a thickness $D_1$ (see FIG. 39) of the resist 50 on the topmost portion of the polycrystalline semiconductor film 13 remaining over the lower electrode 23 is about 1500 angstroms less than a thickness $D_2$ of the resist 50 on the topmost portion of the polycrystalline semiconductor film 13 remaining over the N well 22. Thus, the resist 50 tends to have an increased thickness in order to cover the capacitor.

However, since the resist 50 functions as a mask during the ion implantation as mentioned above, the increased thickness of the resist 50 gives rise to the shadowing effect and the degradation of patterning accuracy.

The polishing for planarization of the interlayer insulation film 30 must be controlled so as not to expose the upper electrode 25, rather than the gate electrode 29. Further, since the upper electrode 25 of the capacitor is formed at a position high above the base layer 1, the interlayer insulation film 30 need to be formed thick. This requires prolonged etching for the formation of a contact hole 33 for electrical connection to the source/drain region 26. On the other hand, a contact hole 32 for electrical connection to the upper electrode 25 is shallower than the contact hole 33, as shown in FIG. 38, and the depth difference between the contact holes 32 and 33 is as large as 2000 angstroms. For this reason, the prolonged etching for reliable formation of the contact hole 33 is liable to cause overetching for the formation of the contact hole 32, resulting in the removal of the silicide film 28 on the upper electrode 25. The removal of the silicide film 28 on the upper electrode 25 presents the problem of the increase in electric resistance between the electrode filling the contact hole 32 and the upper electrode 25.

SUMMARY OF THE INVENTION

It is therefore an object of the present invention to provide a technique for reducing the height of a capacitor above a substrate.

The present invention is intended for a method of manufacturing a capacitor. According to the present invention, the method includes steps (a) through (d). In the step (a), a trench is formed in a surface of a substrate. In the step (b), an insulation film filling the trench is formed. In the step (c), the insulation film is selectively removed to form an isolating insulation film in the trench. The isolating insulation film has a recess on an opposite side from the substrate. The recess has a bottom deeper than the surface of the substrate. In the step (d), a lower electrode is formed on the bottom, a dielectric layer is formed on the lower electrode, and an upper electrode is formed on the dielectric layer.

The method can reduce a distance from the substrate to the upper electrode. The thickness of a resist for use in a subsequent photolithographic technique is accordingly reduced. This reduces the shadowing effect and the degradation of patterning accuracy when performing the photolithographic technique.

Additionally, in an interlayer insulation film to be formed subsequently, the depth of a contact hole for electrical connection to the upper electrode is made approximately equal to the depth of a contact hole for electrical connection to other portions. This solves a problem such that overetching of the contact hole for electrical connection to the upper electrode occurs to increase an electric resistance.

Moreover, since the recess is provided in the isolating insulation film selectively provided in the substrate, there is no need to polish the insulation film from which the isolating insulation film is formed, after the formation of the lower electrode. Therefore, the lower electrode is not polished.

Preferably, the step (b) includes steps (b-1) and (b-2). In the step (b-1), the insulation film is selectively etched to reduce the thickness of a portion of the insulation film spaced not less than a predetermined distance apart from the trench. In the step (b-2), the insulation film is polished to form the isolating insulation film having the recess in the trench. The step (b-2) is performed after the step (b-1).

The method can easily form the isolating insulation film having the recess by utilizing dishing caused by polishing of the insulation film.

Preferably, the substrate is devoid of any semiconductor device disposed near the trench.

The method does not provide a semiconductor device to be influenced by dishing.

Preferably, the insulation film is removed in the center of the trench to define the recess in the step (b-1).

The method can easily form the isolating insulation film having the recess because the insulation film is removed also in the center of the trench.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 15 and 16 are schematic sectional views showing a method of manufacturing the capacitor in a step-by-step manner according to a second preferred embodiment of the present invention;

FIGS. 17 through 26 are schematic sectional views showing a method of manufacturing the capacitor in a step-by-step manner according to a third preferred embodiment of the present invention;

DESCRIPTION OF THE PREFERRED EMBODIMENTS

First Preferred Embodiment

Figure 1:
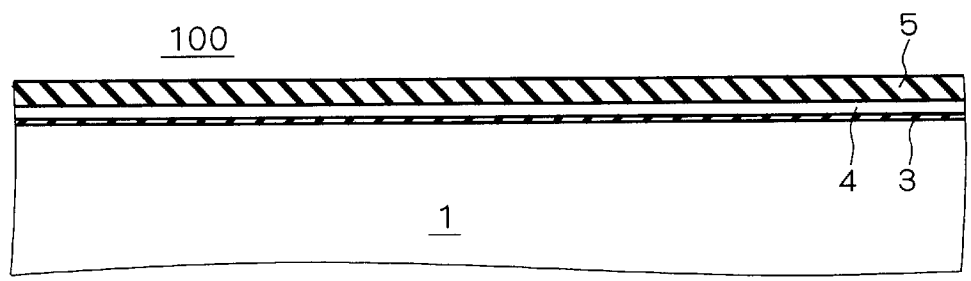
FIGS. 1 through 13 are schematic sectional views showing a method of manufacturing a capacitor in a step-by-step manner according to a first preferred embodiment of the present invention.

FIGS. 1 through 13 are schematic sectional views showing a method of manufacturing a capacitor in a step-by-step manner according to a first preferred embodiment of the present invention. First, a semiconductor oxide film 3, a semiconductor film 4 and a semiconductor nitride film 5 are deposited in the order named on a base layer 1 (FIG. 1). The base layer 1 is made of, e.g., silicon, and the semiconductor oxide film 3 is made of, e.g., silicon oxide. The semiconductor film 4 is made of, e.g., polycrystalline silicon (polysilicon), and the semiconductor nitride film 5 is made of, e.g., silicon nitride. This provides a substrate 100 of the capacitor.

Figure 2:
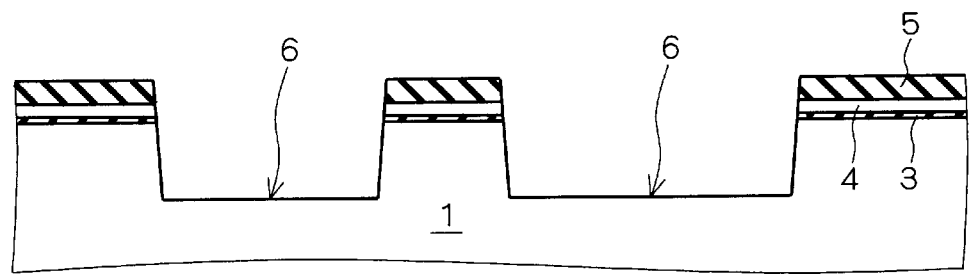

Next, a photolithographic technique is used to selectively remove the semiconductor oxide film 3, the semiconductor film 4, the semiconductor nitride film 5 and the base layer 1, thereby forming trenches 6 in the surface of the substrate 100 (FIG. 2). The trenches 6 extend through the semiconductor oxide film 3, the semiconductor film 4 and the semiconductor nitride film 5, and have respective bottoms in the base layer 1. The bottoms of the respective trenches 6 are at a depth of, e.g., 3000 to 4000 angstroms from the surface of the base layer 1.

Figure 3:
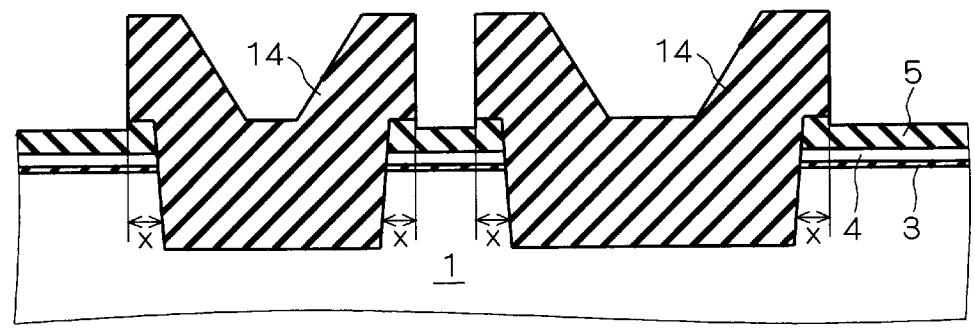

Then, a semiconductor oxide film 14 is deposited on the structure shown in FIG. 2 to fill the trenches 6 with the semiconductor oxide film 14. The semiconductor oxide film 14 is made of, e.g., silicon oxide. Thereafter, a photolithographic technique is used to selectively remove the semiconductor oxide film 14. Specifically, a portion of a surface of the semiconductor nitride film 5 which is spaced not less than a predetermined distance x apart from the trenches 6 is selectively exposed (FIG. 3). The trenches 6 remain filled with the semiconductor oxide film 14. In this process, the semiconductor nitride film 5, in some cases, is etched somewhat to a reduced thickness, as shown in FIG. 3.

Figure 4:
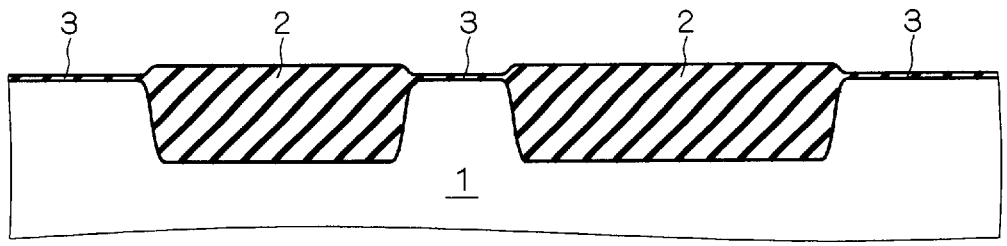

Next, chemical-mechanical polishing is performed to remove other semiconductor oxide film 14 than fills the trenches 6. The semiconductor nitride film 5 and the semiconductor film 4 are removed by using wet etching. The remaining portions of the semiconductor oxide film 14 subjected to these processes become isolation oxide films 2 (FIG. 4).

Figure 5:
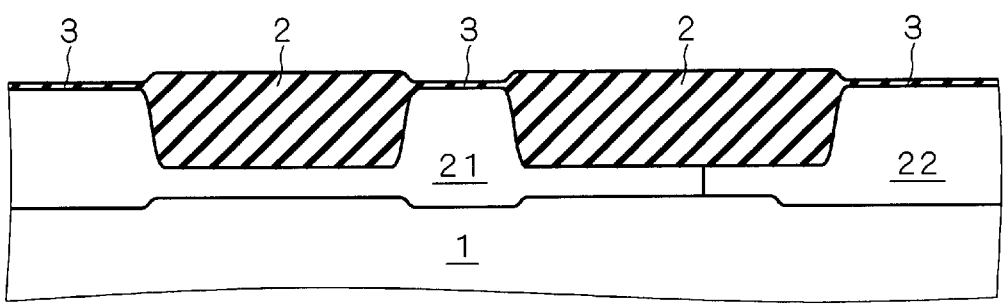

A photolithographic technique and an impurity implantation process are used to form a P well 21 and an N well 22 in an upper surface of the base layer 1 under the isolation oxide films 2 and the semiconductor oxide film 3 (FIG. 5). In FIG. 5, a boundary between the P well 21 and the N well 22 is present under the right-hand isolation oxide film 2.

Figure 6:
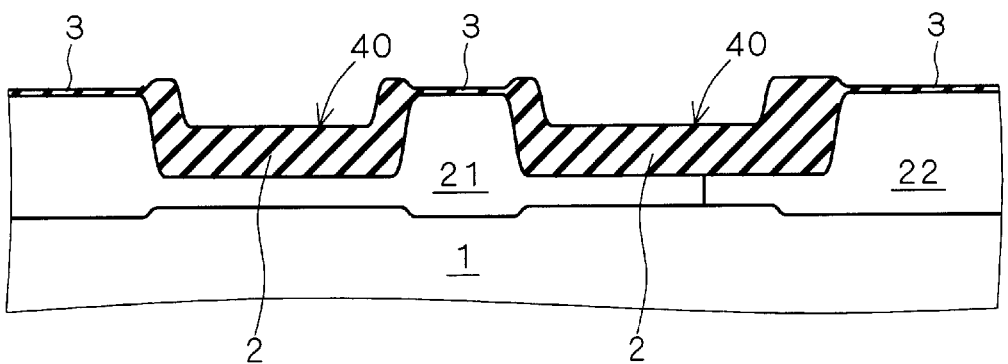

A photolithographic technique is used to selectively remove the isolation oxide films 2 to form a recess 40 opening in an opposite direction from the base layer 1 in the center of each of the isolation oxide films 2 (FIG. 6). The bottoms of the respective recesses 40 are deeper (i.e., closer to the base layer 1) than the surfaces of the P well 21 and the N well 22. The amount by which the isolation oxide films 2 are etched for the formation of the recesses 40 is, e.g., about 1500 angstroms. For example, the isolation oxide films 2 of about 1500 to 2500 angstroms in thickness lie under the respective recesses 40.

Figure 7:
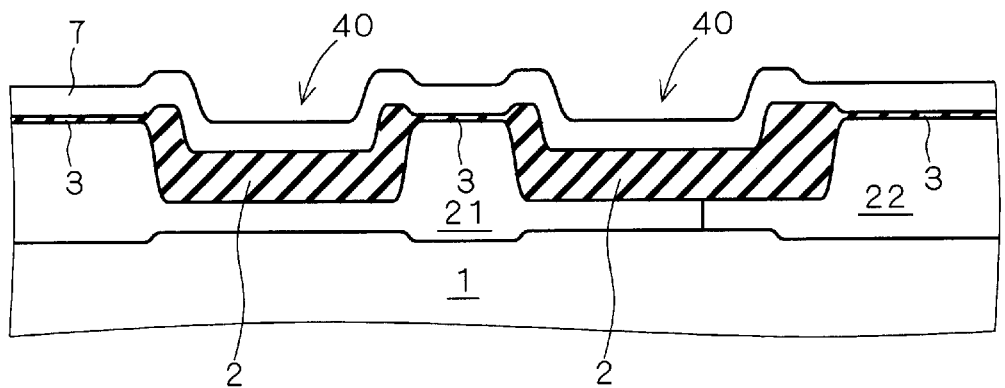

A polycrystalline semiconductor film 7 is deposited on the entire top surfaces of the isolation oxide films 2 including the recesses 40 and the semiconductor oxide film 3 (FIG. 7). The polycrystalline semiconductor film 7 is made of, e.g., doped polysilicon, and has a thickness of about 1000 angstroms.

A photolithographic process is used to selectively remove the polycrystalline semiconductor film 7 so that the polycrystalline semiconductor film 7 remains only on the bottom of each of the recesses 40. The remaining portions of the polycrystalline semiconductor film 7 serve as lower electrodes 23, respectively (FIG. 8).

The use of a photomask may be shared between the photolithographic technique used for the selective removal of the polycrystalline semiconductor film 7 for the formation of the lower electrodes 23 and the photolithographic technique used for the selective removal of the isolation oxide films 2 for the formation of the recesses 40. For example, the two photolithographic techniques employ respective positive resists having the same exposure characteristic. The amount of exposure to light for the selective removal of the isolation oxide films 2 is made greater than that for the selective removal of the polycrystalline semiconductor film 7, for example, by about 10%, whereby the width (a dimension as measured in a direction perpendicular to the thickness of the base layer 1) of the bottom of each of the recesses 40 is greater than that of each of the lower electrodes 23.

Figure 8:
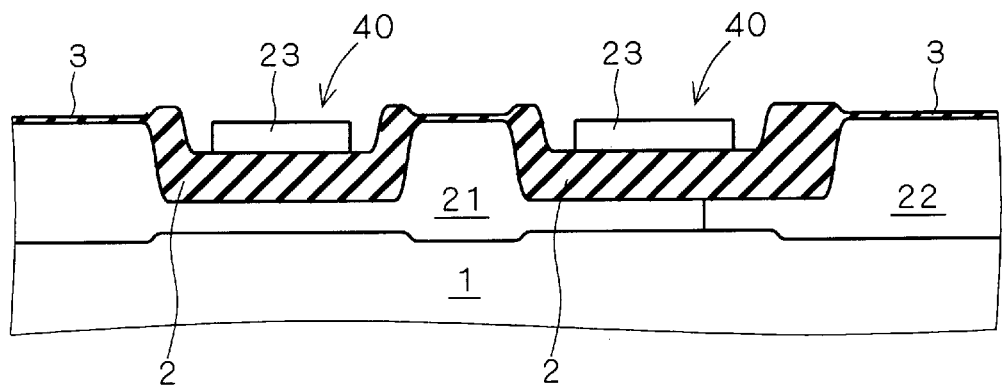
Figure 9:
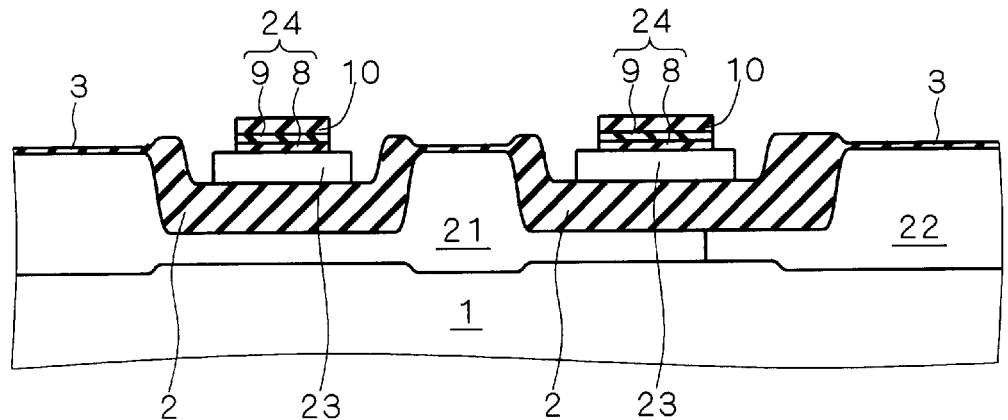

Next, a semiconductor oxide film 8, a semiconductor nitride film 9 and a semiconductor oxide film 10 are deposited in the order named on the structure shown in FIG. 8. The semiconductor oxide film 8, the semiconductor nitride film 9 and the semiconductor oxide film 10 are, e.g., 200, 300 and 500 angstroms, respectively, in thickness. A photolithographic technique is used to selectively remove the semiconductor oxide film 10 so that the semiconductor oxide film 10 remains only over each of the lower electrodes 23. The dimension of each of the remaining portions of the semiconductor oxide film 10 is smaller than that of each of the lower electrodes 23. Thereafter, using the remaining portions of the semiconductor oxide film 10 as a mask, wet etching is performed to selectively remove the semiconductor oxide film 8 and the semiconductor nitride film 9 (FIG. 9). The remaining portions of the semiconductor oxide film 8 and semiconductor nitride film 9 function as a dielectric layer 24 of a capacitor.

Figure 10:
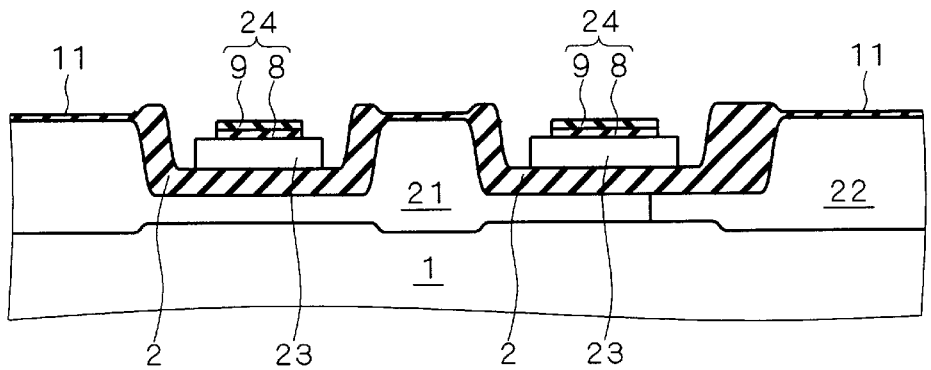

The semiconductor oxide film 3, which has been damaged by the processes performed thus far, is removed by wet etching. In this process, the remaining portions of the semiconductor oxide film 10 are also removed. An oxidation process is performed anew to form an oxide film 11 on the upper surfaces of the P well 21 and the N well 22 (FIG. 10). The oxide film 11 functions also as a gate oxide film of a MOS transistor.

Figure 11:
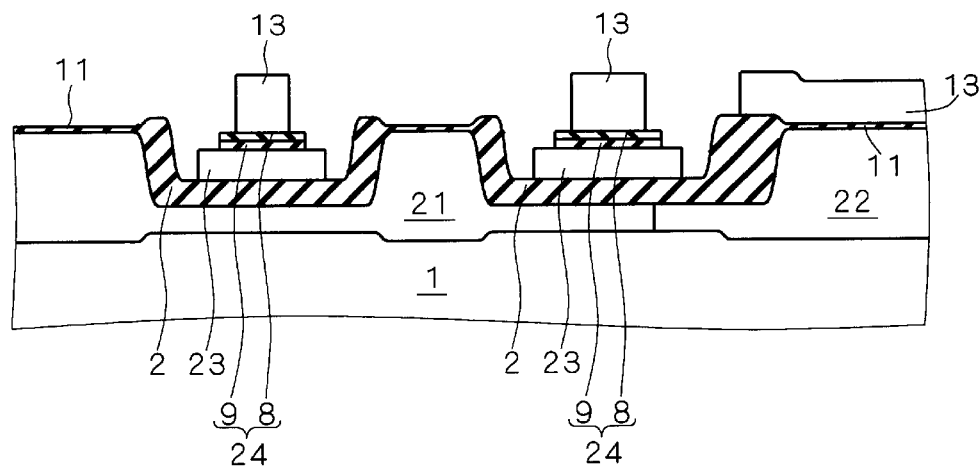
Figure 12:
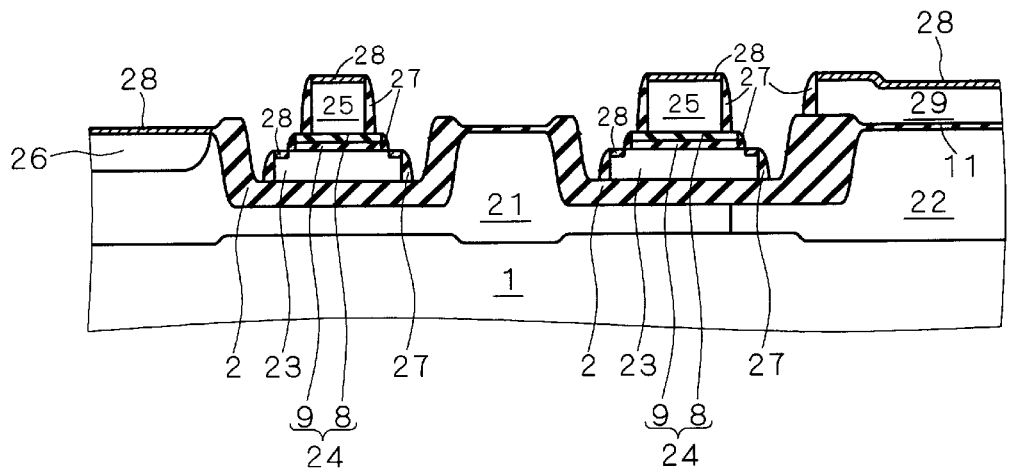

Next, a polycrystalline semiconductor film 13 is deposited on the structure shown in FIG. 10. The polycrystalline semiconductor film 13 is made of, e.g., polysilicon. A photolithographic technique is used to selectively remove the polycrystalline semiconductor film 13 so that portions of the polycrystalline semiconductor film 13 remain on the oxide film 11 and the isolation oxide film 2 over the P and N wells 21 and 22 in spaced apart relation to the lower electrodes 23, and on the semiconductor nitride film 9 (FIG. 11). The dimension of a portion of the polycrystalline semiconductor film 13 remaining on the semiconductor nitride film 9 is smaller than that of the semiconductor nitride film 9. The portion of the polycrystalline semiconductor film 13 remaining on the semiconductor nitride film 9 is subjected to ion implantation to be described below to thereby function as an upper electrode which, in conjunction with the lower electrode 23, constitutes the capacitor with the dielectric layer 24 therebetween. The portion of the polycrystalline semiconductor film 13 remaining on the oxide film 11 and the isolation oxide film 2 is subjected to ion implantation to be described below to thereby function as a gate electrode of a MOS transistor which forms a channel in the upper surface of each of the P well 21 and the N well 22 thereunder. The portion of the polycrystalline semiconductor film 13 functioning as the gate electrode of an NMOS transistor to be formed in the P well 21 is not shown in the sectional view of FIG. 11.

Thereafter, ions are implanted into the remaining portions of the polycrystalline semiconductor film 13 and through the oxide film 11 into the P well 21 and the N well 22 to form a source/drain region 26, a gate electrode 29, and upper electrodes 25. The gate electrode of the MOS transistor to be formed in the P well 21 and the source/drain region of the MOS transistor to be formed in the N well 22 are not shown in the sectional view of FIG. 12.

The source/drain regions of the MOS transistors are exposed by the selective removal of the semiconductor oxide film 11 thereover. Silicide films 28 are formed on the exposed surfaces of the source/drain regions and the gate electrodes. In the ion implantation process, sidewalls 27 made of, e.g., TEOS may be used as a mask in addition to a mask using a resist to be described later. The removal of the resist provides a structure shown in FIG. 12.

Figure 13:
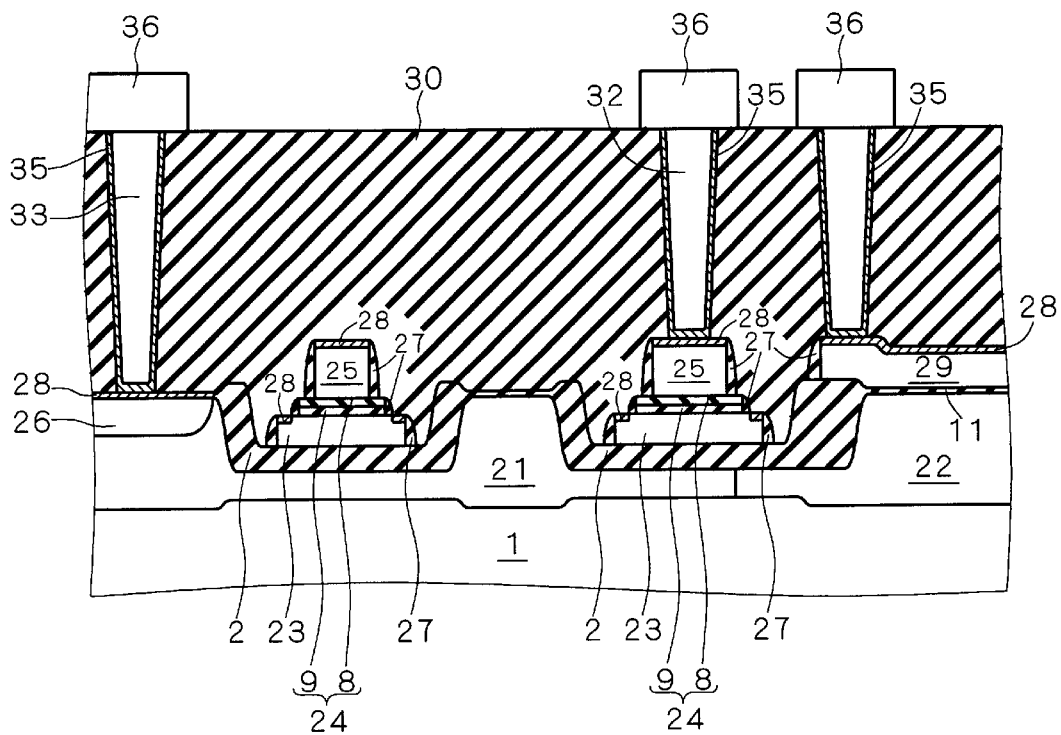

Next, an interlayer insulation film 30 made of, e.g., silicon oxide is deposited on the entire top surface, and chemical-mechanical polishing is performed to planarize the surface of the interlayer insulation film 30. A photolithographic technique is used to form contact holes for electrical connections to the source/drain region 26, the gate electrode 29, and the upper and lower electrodes 25 and 23. Barrier metals 35 are formed in the respective contact holes. Electrodes 36 are formed which fill the respective contact holes with the barrier metals 35 therebetween and protrude from the surface of the interlayer insulation film 30 (FIG. 13).

In the first preferred embodiment, the lower electrode 23 is formed on the bottom of the recess 40, the bottom being deeper than the surfaces of the P well 21 and the N well 22. This reduces a distance between the farthest position of the upper electrode 25 from the base layer 1 and the farthest position of the gate electrode 29 from the base layer 1, as compared with the background art. In other words, the first preferred embodiment can reduce a distance from the base layer 1 to the upper electrode 25.

Figure 14:
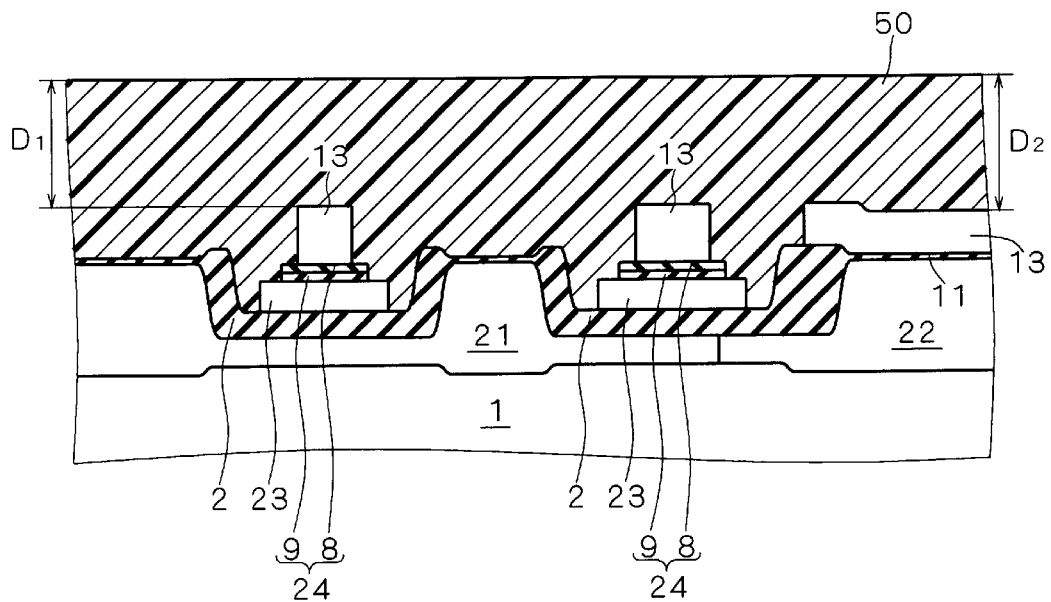
FIG. 14 is a sectional view showing an effect of the method of manufacturing the capacitor according to the first preferred embodiment of the present invention.

A resist 50 serving as a mask is used in the ion implantation for the formation of the upper electrode 25, the source/drain region 26 and the gate electrode 29. FIG. 14 is a sectional view schematically showing the resist 50. The patterning to be actually used is not shown in FIG. 14, and hence the resist 50 is shown as formed entirely without any specified position to be opened therein.

The above-mentioned distance between the upper electrode 25 and the gate electrode 29 in the first preferred embodiment is less than that in the background art. Thus, a thickness $D_1$ of the resist 50 on the topmost portion of the polycrystalline semiconductor film 13 remaining over the lower electrode 23 is approximately equal to a thickness $D_2$ of the resist 50 on the topmost portion of the polycrystalline semiconductor film 13 remaining over the N well 22. A comparison with the background art thickness of the resist 50 shows that the first preferred embodiment can reduce the thickness $D_2$. This accordingly reduces the shadowing effect and the degradation of patterning accuracy when performing the photolithographic technique using the resist 50.

In the process of polishing the interlayer insulation film 30, the upper electrode 25 is less likely to emerge even if the amount of polishing which prevents the emergence of the gate electrode 29 is adopted.

Further, a contact hole 32 for electrical connection to the upper electrode 25 and a contact hole 33 (see FIG. 13) for electrical connection to the source/drain region 26 are approximately equal in depth to each other. This reduces the overetching of the contact hole 32 occurring for the formation of the contact hole 33, thereby to solve the problem of the increase in electric resistance resulting from the overetching in the contact hole 32.

Additionally, the recesses 40 in which the polycrystalline semiconductor film 7 remains to function as the lower electrodes 23 later are formed in the isolation oxide films 2, respectively. This eliminates the need to planarize the isolation oxide films 2 by polishing in a later process, and also prevents the polycrystalline semiconductor film 7 from being polished.

Second Preferred Embodiment

FIGS. 15 and 16 are schematic sectional views showing a method of manufacturing the capacitor in a step-by-step manner according to a second preferred embodiment of the present invention. The trenches 6 are formed in a manner similar to the first preferred embodiment, and the structure shown in FIG. 2 is provided. Then, the semiconductor oxide film 14 which fills the trenches 6 is deposited to provide a structure shown in FIG. 15.

Next, a photolithographic technique is used to selectively remove the semiconductor oxide film 14, thereby reducing the thicknesses of a portion of the semiconductor oxide film 14 in the center of each of the trenches 6 and a portion of the semiconductor oxide film 14 on the semiconductor nitride film 5 which is spaced not less than the predetermined distance x apart from the trenches 6. This provides the recesses 40 formed in the semiconductor oxide film 14 which has filled the respective trenches 6, as shown in FIG. 16.

Thereafter, chemical-mechanical polishing is performed on the semiconductor oxide film 14 so that the semiconductor oxide film 14 remains only in the trenches 6, as in the first preferred embodiment. The semiconductor nitride film 5 and the semiconductor film 4 are removed by using wet etching. The semiconductor oxide film 14 subjected to these processes remains in the form of the isolation oxide films 2 having the respective recesses 40. Then, a photolithographic technique and an impurity implantation process are used to form the P well 21 and the N well 22 in the upper surface of the base layer 1 under the isolation oxide films 2 and the semiconductor oxide film 3, thereby providing the structure shown in FIG. 6. The subsequent manufacturing steps are performed in a manner similar to the first preferred embodiment.

The first preferred embodiment comprises a total of two steps of patterning the semiconductor oxide film 14 and the oxide films 2 to be formed therefrom, that is, during the process of forming the structure shown in FIG. 3 from the structure shown in FIG. 2 and during the process of forming the structure shown in FIG. 6 from the structure shown in FIG. 5. In the second preferred embodiment, on the other hand, it is sufficient to perform the step of patterning the semiconductor oxide film 14 only once during the process of forming the structure shown in FIG. 16 from the structure shown in FIG. 15. Thus, the second preferred embodiment can reduce the number of patterning steps to provide a simplified manufacturing method.

When selectively removing the semiconductor oxide film 14 by using the photolithographic technique, the second preferred embodiment must avoid the complete removal of the semiconductor oxide film 14 in the center of each of the trenches 6, which will result in a short circuit between the lower electrodes 23 and the P well 21 to be formed later. It is, hence, necessary to appropriately set the thickness by which the semiconductor oxide film 14 is to be reduced. Preferably, the thickness of the semiconductor oxide film 14 remaining in the center of each of the trenches 6 is about 1500 to about 2500 angstroms.

The rates of deposition of the semiconductor oxide film 14 near the center of the trench 6 and on the semiconductor nitride film 5 are considered to be approximately equal to each other. Therefore, the non-exposure of the semiconductor nitride film 5 may be adopted as criteria in patterning of the semiconductor oxide film 14 in the second preferred embodiment, since it is presumed that the base layer 1 is not exposed near the center of each of the trenches 6 when the semiconductor nitride film 5 is not exposed.

Third Preferred Embodiment

Figure 38:
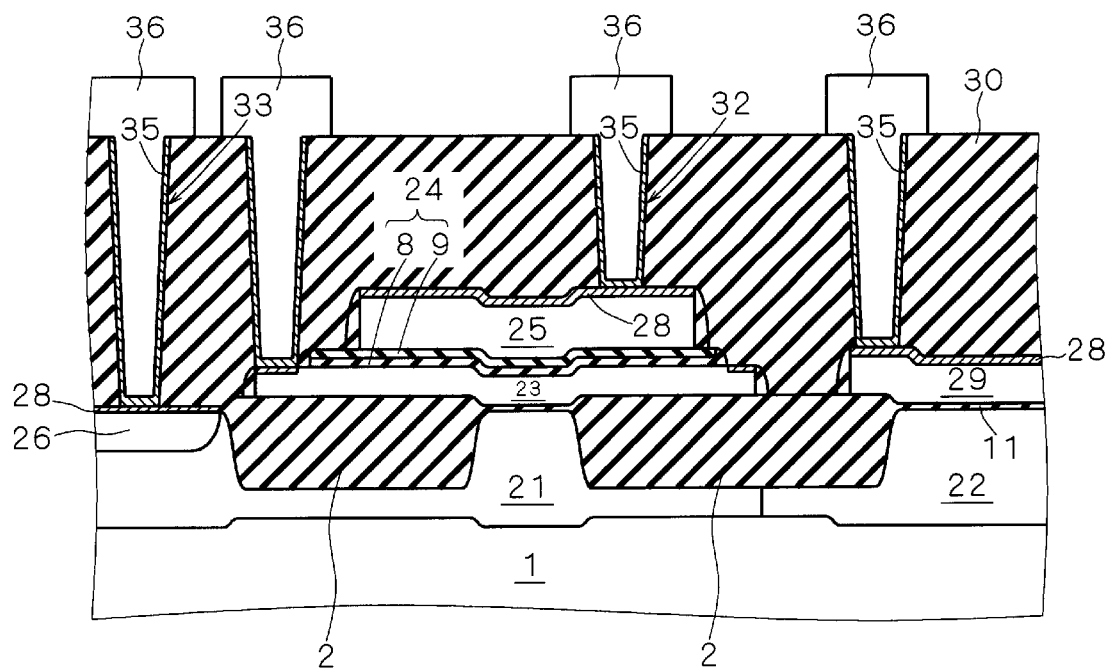
Figure 39:
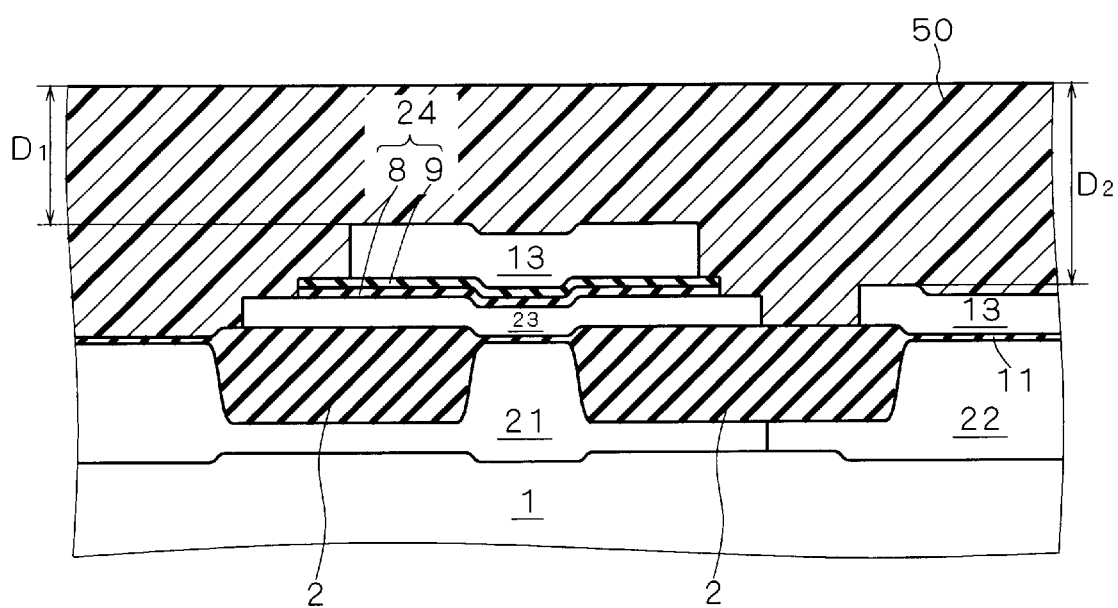
FIG. 39 is a sectional view showing a problem associated with the background art method of manufacturing the capacitor.

As shown in FIG. 38 with regard to the background art and in FIG. 13 with regard to the first and second preferred embodiments, the isolation oxide films 2 are not continuous with each other but are discrete in an area wherein capacitors are to be provided. This is to avoid the non-uniformity of the amount of polishing known as "dishing" occurring during the chemical-mechanical polishing of the semiconductor oxide film 14.

In general, the capacitors are provided over an extensive area. Thus, the provision of the isolation oxide films 2 in succession so as to conform to the dimensions of the capacitors in such an extensive area involves the chemical-mechanical polishing of the semiconductor oxide film 14 provided in this extensive area. This results in the above-mentioned non-uniformity of the amount of polishing of the semiconductor oxide film 14. In particular, the amount of polishing decreases with increasing distance from the center of the semiconductor oxide film 14.

Such dishing is not desirable since it exerts an influence upon characteristics of devices, e.g. transistors, disposed on the periphery thereof. For this reason, the isolation oxide films 2 have been provided discretely, rather than continuously, in the area wherein the capacitors are to be provided.

From a different point of view, however, the dishing may be said to increase the amount of polishing of the semiconductor oxide film 14 in the center thereof, thereby easily providing the isolation oxide films 2 recessed in the center thereof. A third preferred embodiment of the present invention proposes a method of manufacturing the capacitor which utilizes the recess of the isolation oxide film resulting from the dishing to reduce the distance between the upper electrode 25 and the base layer 1.

FIGS. 17 through 26 are schematic sectional views showing the method of manufacturing the capacitor in a step-by-step manner according to the third preferred embodiment of the present invention. First, a trench 6 is formed in a manner similar to the first preferred embodiment, and a structure shown in FIG. 17 is provided. The width W of the trench 6 is set at a large value which allows a large degree of dishing to occur during the chemical-mechanical polishing of the semiconductor oxide film 14 to be described later. For example, the width W is set at 100 $\mu$m.

Figure 18:
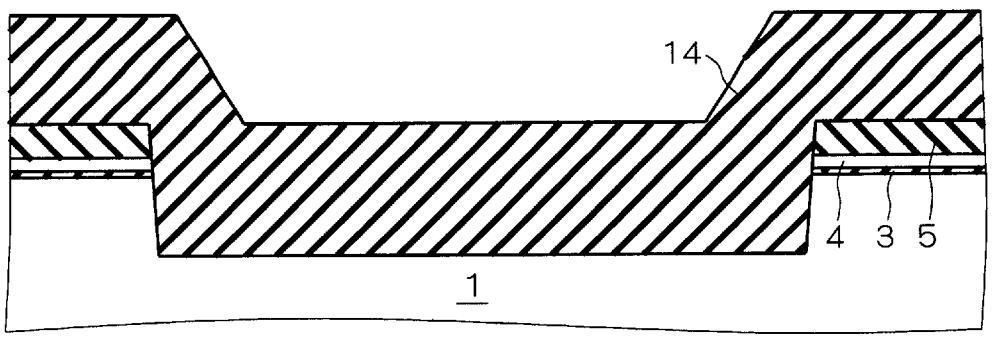

Thereafter, the semiconductor oxide film 14 which fills the trench 6 is deposited to provide a structure shown in FIG. 18.

Figure 19:
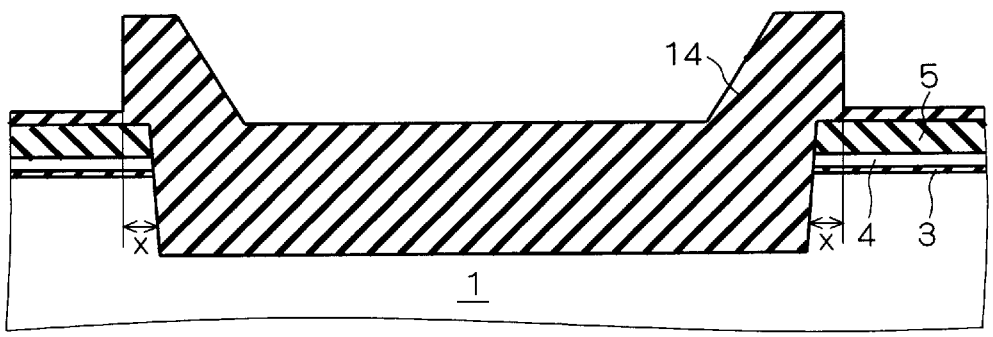

Next, a photolithographic technique is used to selectively remove the semiconductor oxide film 14, thereby reducing the thickness of a portion of the semiconductor oxide film 14 on the semiconductor nitride film 5 which is spaced not less than the predetermined distance x apart from the trench 6 (FIG. 19). Thus, the method of the third preferred embodiment comprises neither removing the portion of the semiconductor oxide film 14 on the semiconductor nitride film 5 as in the first preferred embodiment nor etching the portion of the semiconductor oxide film 14 in the center of the trench 6 as in the second preferred embodiment.

Figure 20:
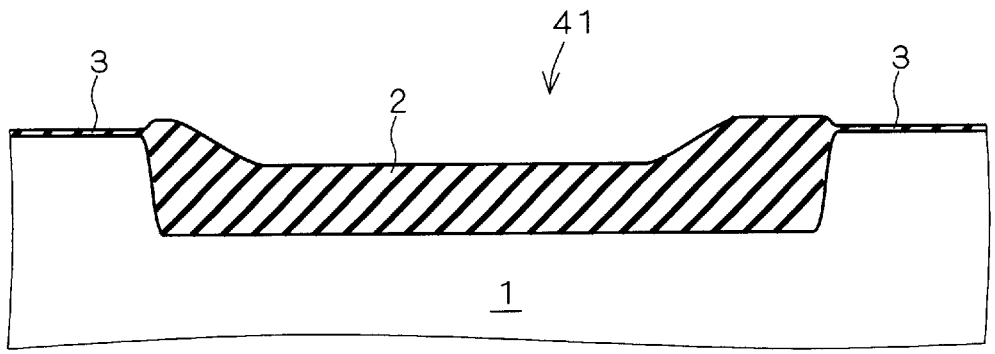

Thereafter, chemical-mechanical polishing is performed on the semiconductor oxide film 14 to remove other than a portion of the semiconductor oxide film 14 filling the trench 6. The semiconductor nitride film 5 and the semiconductor film 4 are removed by using wet etching. The remaining portion of the semiconductor oxide film 14 subjected to these processes becomes the isolation oxide film 2 (FIG. 20). Because of the occurrence of the dishing, the isolation oxide film 2 has a recess 41 in the center thereof which is sunk by about 1500 angstroms. The bottom of the recess 41 is deeper than the surface of the base layer 1. For example, the isolation oxide film 2 of 1500 to 2500 angstroms in thickness lies under the recess 41.

Figure 21:
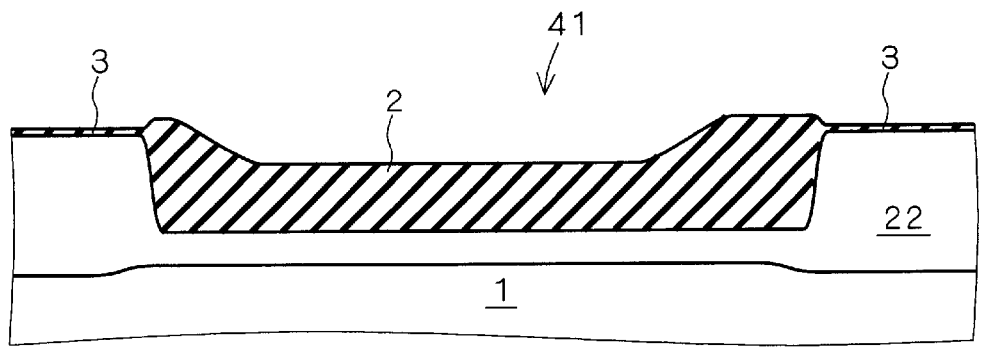

Then, a photolithographic technique and an impurity implantation process are used to form the N well 22 serving as a dummy well in the upper surface of the base layer 1 under the isolation oxide film 2 and the semiconductor oxide film 3 (FIG. 21).

A polycrystalline semiconductor film made of, e.g., doped polysilicon and having a thickness of about 1000 angstroms is deposited on the entire top surfaces of the isolation oxide film 2 and the semiconductor oxide film 3. The polycrystalline semiconductor film is selectively removed by using a photolithographic technique to become the lower electrode 23 remaining on, or also near as well as on, the bottom of the recess 41 (FIG. 22).

Figure 22:
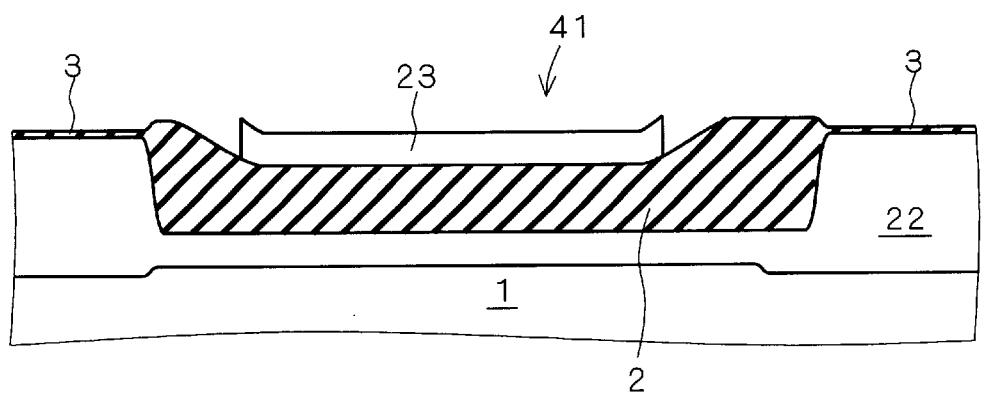
Figure 23:
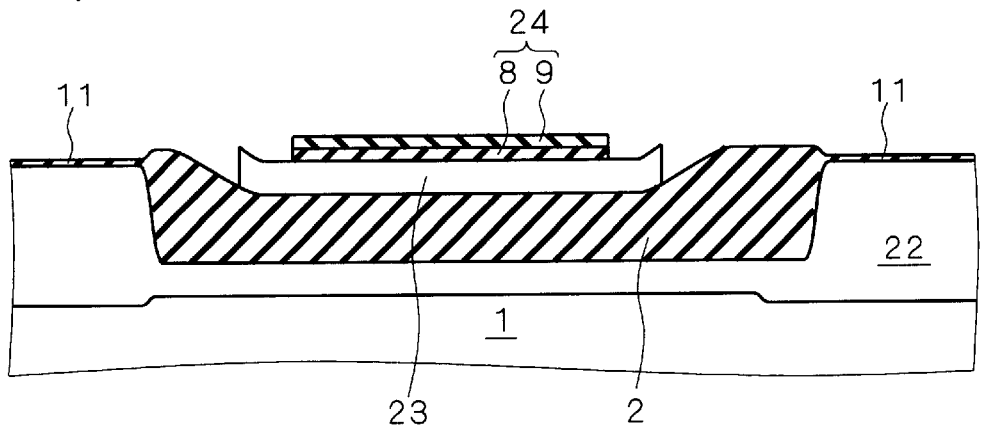

Next, the semiconductor oxide film 8, the semiconductor nitride film 9 and the semiconductor oxide film 10 are deposited in the order named on the structure shown in FIG. 22 in a manner similar to the first preferred embodiment. The semiconductor oxide film 8, the semiconductor nitride film 9 and the semiconductor oxide film 10 are patterned in a manner similar to the first preferred embodiment. Thus, the semiconductor oxide film 8 and the semiconductor nitride film 9 constitute the dielectric layer 24 of the capacitor. Then, wet etching is performed to remove the semiconductor oxide film 3 and the semiconductor oxide film 10. An oxidation process is performed anew to form the oxide film 11 on the upper surface of the N well 22 (FIG. 23).

The polycrystalline semiconductor film 13 is deposited in a manner similar to the first preferred embodiment, and is patterned to remain on the semiconductor nitride film 9 (FIG. 24).

Thereafter, ion implantation is performed to form the upper electrode 25 of the capacitor, and the silicide films 28 are formed, as in the first preferred embodiment. In the ion implantation process, the sidewalls 27 may be used as a mask. The removal of the resist used as a mask in the ion implantation process provides a structure shown in FIG. 25.

Figure 26:
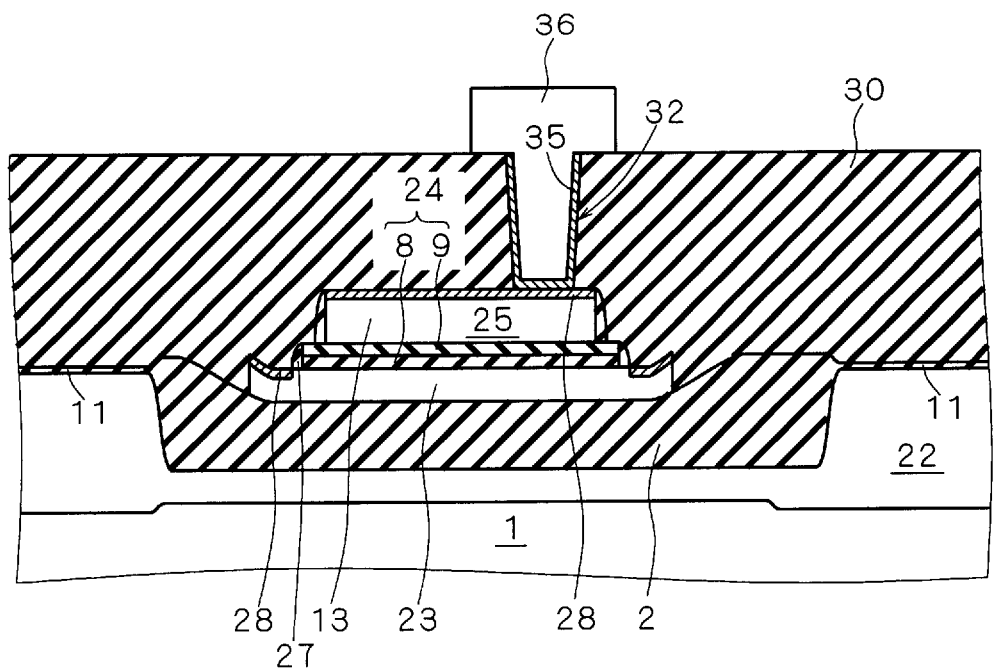

Next, the interlayer insulation film 30 made of, e.g., silicon oxide is deposited on the entire top surface, and chemical-mechanical polishing is performed to planarize the surface of the interlayer insulation film 30. A photolithographic technique is used to form contact holes for electrical connections to the source/drain region 26, the gate electrode 29, and the upper and lower electrodes 25 and 23 of the capacitor. The barrier metal 35 is formed in the contact hole. The electrode 36 is formed which fills the contact hole with the barrier metal 35 therebetween and protrudes from the surface of the interlayer insulation film 30 (FIG. 26).

The third preferred embodiment can also reduce the height of the upper electrode 25 above the base layer 1 to produce effects similar to those of the first and second preferred embodiments.

Figure 27:
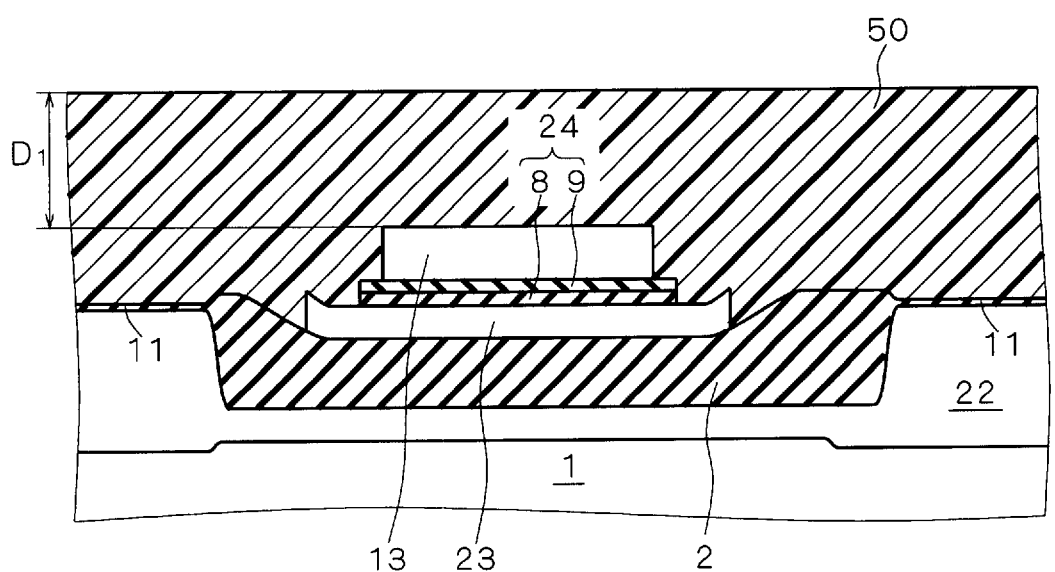
FIG. 27 is a sectional view showing an effect of the method of manufacturing the capacitor according to the third preferred embodiment of the present invention.
Figure 28:
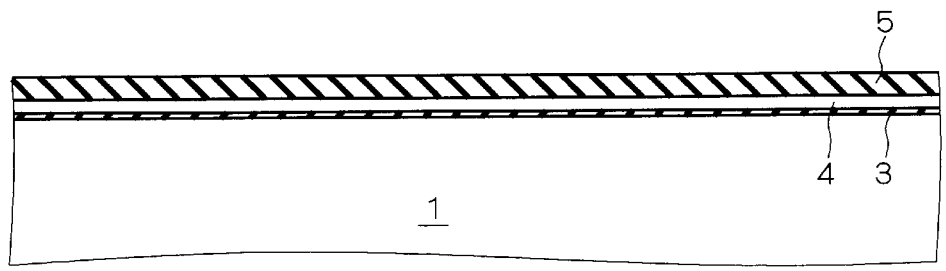
FIGS. 28 through 38 are schematic sectional views showing a background art method of manufacturing a capacitor.
Figure 29:
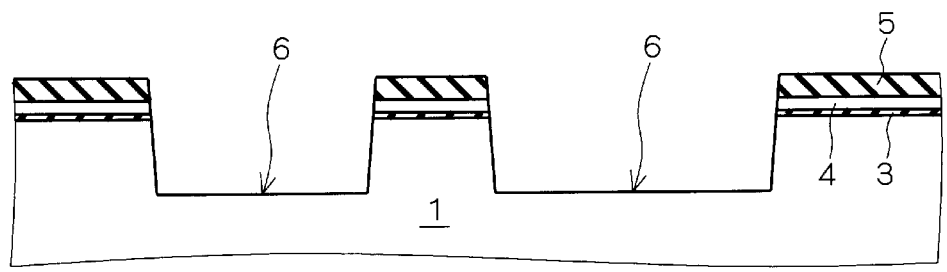
Figure 30:
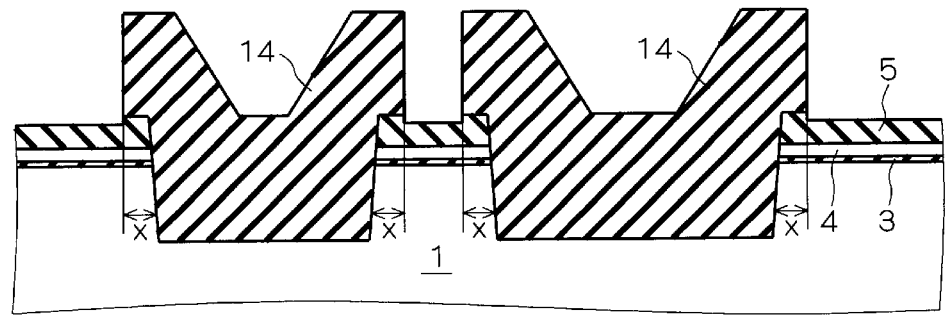
Figure 31:
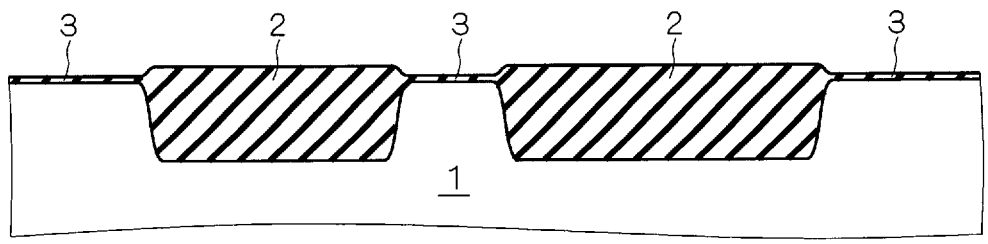
Figure 32:
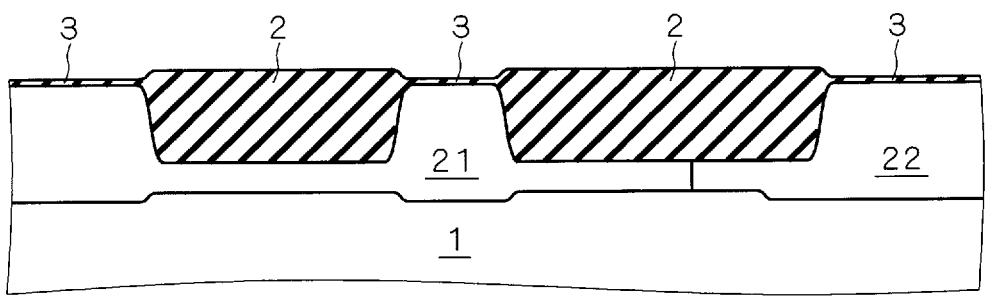
Figure 33:
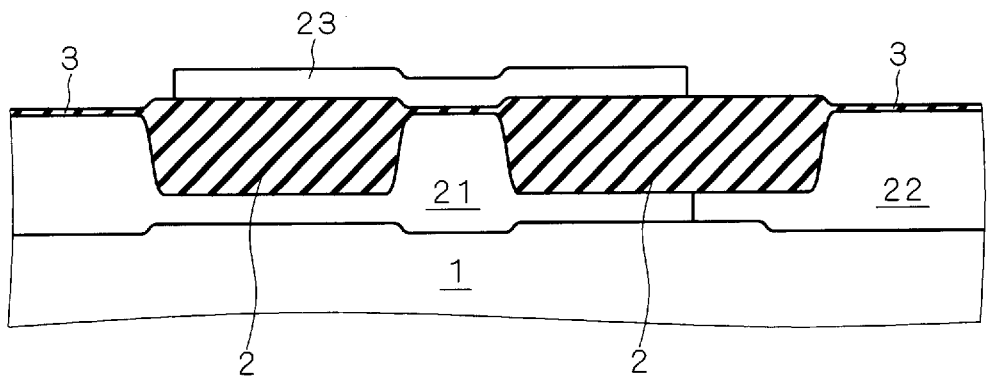
Figure 34:
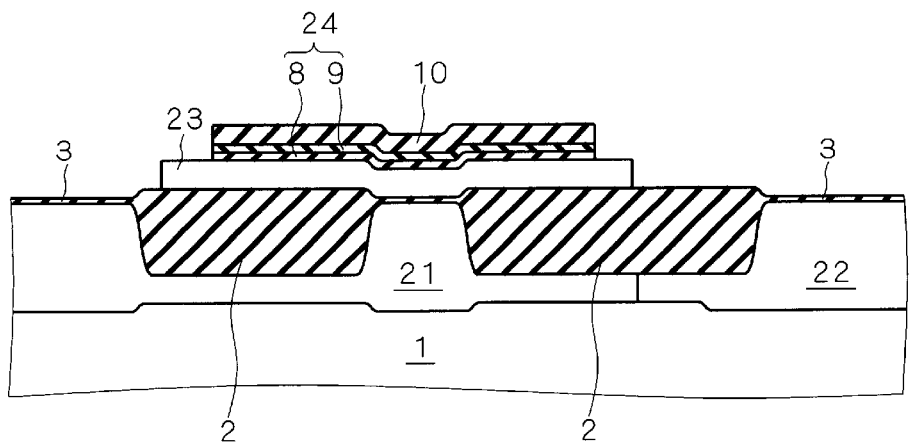
Figure 35:
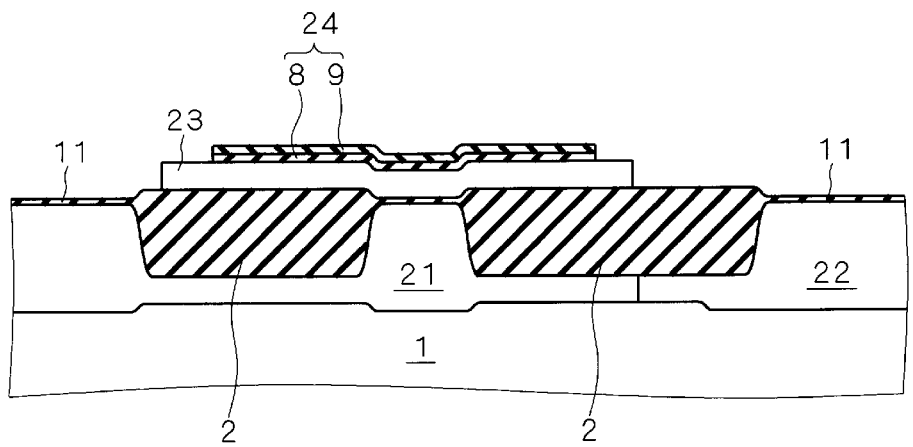
Figure 36:
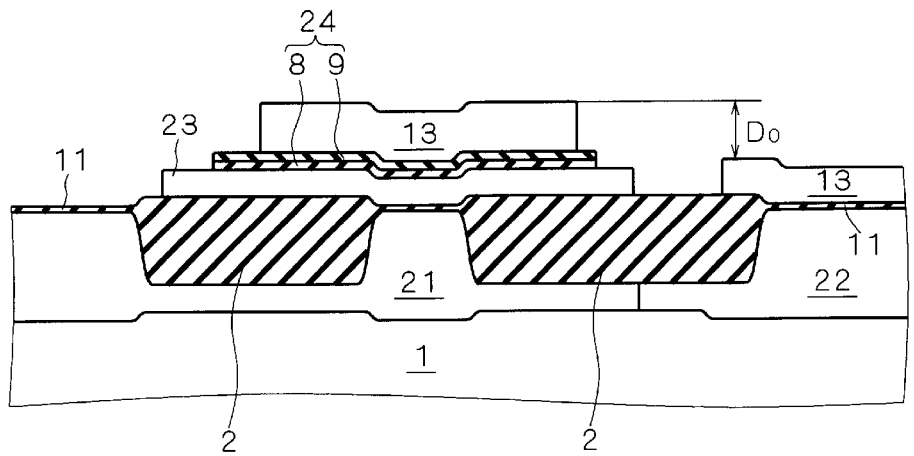
Figure 37:
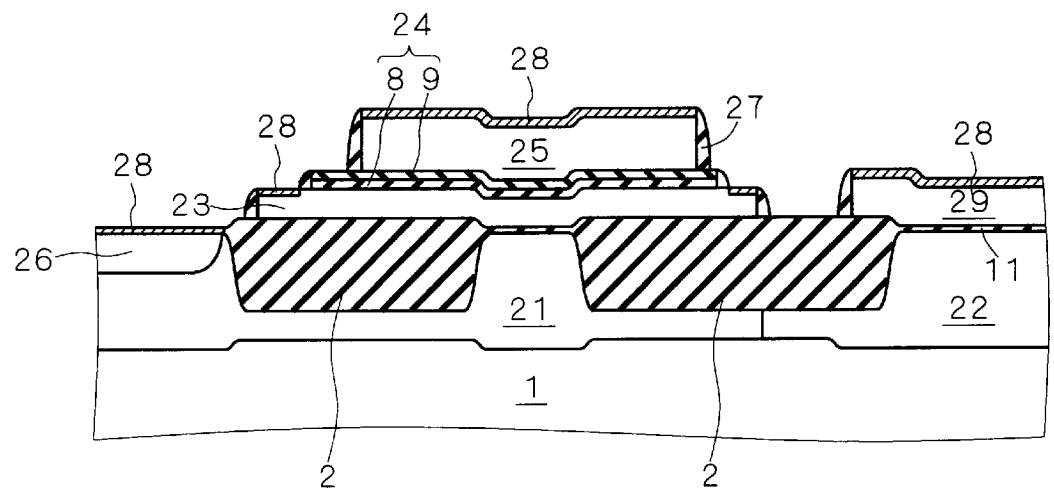

The resist 50 will be considered which serves as a mask, for example, in the ion implantation for the formation of the source/drain region and the gate electrode in positions not shown. FIG. 27 is a sectional view schematically showing the resist 50. The patterning to be actually used is not shown in FIG. 27, and hence the resist 50 is shown as formed entirely without any specified position to be opened therein. Like the first preferred embodiment, the third preferred embodiment can make the thickness $D_1$ of the resist 50 on the topmost portion of the polycrystalline semiconductor film 13 remaining over the lower electrode 23 approximately equal to the thickness of the resist on the gate electrode.

In the third preferred embodiment, it is desirable that a semiconductor device such as a transistor is not disposed near the trench 6. This is to prevent the provision of any semiconductor device to be influenced by dishing as described above.

While the invention has been described in detail, the foregoing description is in all aspects illustrative and not restrictive. It is understood that numerous other modifications and variations can be devised without departing from the scope of the invention.

What is claimed is:

1. A method of manufacturing a capacitor, comprising the steps of:
   (a) forming a trench in a surface of a substrate;
   (b) forming an insulation film filling said trench;
   (c) selectively removing said insulation film to form an isolating insulation film in said trench, said isolating insulation film having a recess on an opposite side from said substrate, said recess having a bottom deeper than said surface of said substrate; and
   (d) forming a lower electrode on said bottom such that a width of said bottom is greater than a width of said lower electrode, a dielectric layer on said lower electrode, and an upper electrode on said dielectric layer.

2. The method according to claim 1, wherein said step (b) comprises the step of
   (b-1) selectively removing said insulation film to reduce the thickness of a portion of said insulation film spaced not less than a predetermined distance apart from said trench.

3. The method according to claim 2, wherein said portion of said insulation film spaced not less than the predetermined distance apart from said trench is removed in said step (b-1).

4. The method according to claim 3, wherein said step (b) further comprises the step of
   (b-2) polishing said insulation film to form said isolating insulation film filling said trench,
   said step (b-2) being performed after said step (b-1).

5. The method according to claim 4, wherein said step (b) further comprises the step of
   (b-3) selectively removing said isolating insulation film to form said recess in the center of said trench,
   said step (b-3) being performed after said step (b-2).

6. The method according to claim 2, wherein said portion of said insulation film spaced not less than the predetermined distance apart from said trench is left unremoved in said step (b-1).

7. The method according to claim 6, wherein said step (b) further comprises the step of
   (b-2) selectively removing said isolating insulation film to form said recess in the center of said trench,
   said step (b-2) being performed in the same process as said step (b-1).

8. The method according to claim 7, wherein said step (b) further comprises the step of
   (b-3) polishing said insulation film to form said isolating insulation film having said recess in said trench,
   said step (b-3) being performed after said steps (b-1) and (b-2).

9. The method according to claim 1, wherein said step (b) comprises the steps of:
   (b-1) selectively etching said insulation film to reduce the thickness of a portion of said insulation film spaced not less than a predetermined distance apart from said trench; and
   (b-2) polishing said insulation film to form said isolating insulation film having said recess in said trench,
   said step (b-2) being performed after said step (b-1).

10. The method according to claim 9, wherein said substrate is devoid of any semiconductor device disposed near said trench.

11. The method according to claim 9, wherein said insulation film is removed in the center of said trench to define said recess in said step (b-1).

12. The method of claim 1, further comprising the step of:
   (e) forming sidewalls on said lower electrode within said recess.

13. The method of claim 12, further comprising the step of:
   (f) forming silicide films on said lower electrode and said upper electrode.

14. The method of claim 13, further comprising the step of:
   (g) depositing an interlayer insulation film on said sidewalls, said silicide films, and exposed surfaces of said recess.

* * * * *